United States Patent [19]

Casey, Jr. et al.

[11] 4,160,261
[45] Jul. 3, 1979

[54] MIS HETEROJUNCTION STRUCTURES

[75] Inventors: Horace C. Casey, Jr.; Alfred Y. Cho, both of Summit; Edward H. Nicollian, Murray Hill, all of N.J.

[73] Assignee: Bell Telephone Laboratories, Incorporated, Murray Hill, N.J.

[21] Appl. No.: 869,369

[22] Filed: Jan. 13, 1978

[51] Int. Cl.² .............................................. H01L 29/78
[52] U.S. Cl. ........................................ 357/23; 357/16; 357/61
[58] Field of Search ..................... 357/23, 16, 61, 17

[56] References Cited
U.S. PATENT DOCUMENTS
4,062,035 12/1977 Winstel .................................. 357/17

Primary Examiner—Martin H. Edlow
Attorney, Agent, or Firm—Michael J. Urbano

[57] ABSTRACT

In a metal-insulator-semiconductor (MIS) structure, the I-layer comprises a single-crystal, semi-insulating layer which forms a substantially lattice-matched heterojunction with the underlying S-layer. Illustratively, the structure, grown by MBE, includes an indirect gap AlGaAs I-layer doped with a deep level impurity such as oxygen, iron or chromium, and a GaAs S-layer. GaAs FETs incorporating this MIS structure are described.

9 Claims, 5 Drawing Figures

MIS HETEROJUNCTION STRUCTURES

BACKGROUND OF THE INVENTION

This invention relates to metal-insulator-semiconductor devices.

At the present time, GaAs device technology has been limited to two terminal luminescent (e.g., laser diode) and microwave (e.g., mixer and IMPATT diode) devices and Schottky gate field effect transistors (FETs). Depletion mode FETs that use anodic oxidation or silicon oxynitride for the gate insulation have been reported. The electrical properties of these anodic and pyrolitic dielectrics were investigated by Zeisse et al, *Journal of Vacuum Science Technology*, Volume 14, page 957 (1977), who found that both dielectrics exhibit a significant amount of dispersion and hysteresis in capacitance-voltage (C-V) measurements. These properties, which are caused by interface states between the dielectric and semiconductor, are a problem in MOS and MIS FETs because dispersion increases noise and reduces gain, whereas hysteresis causes the operating point to be a function of previously applied signals.

SUMMARY OF THE INVENTION

We have discovered that interface states can be virtually eliminated, along with dispersion and hysteresis, by replacing the amorphous prior art dielectric with a single-crystal, semi-insulating layer which forms a substantially lattice-matched heterojunction with the underlying semiconductor. In one illustrative embodiment of our invention, an MIS structure includes a metal layer, an $Al_xGa_{1-x}As, 0 < -<1$, single-crystal, semi-insulating layer doped with a deep level impurity such as oxygen, and a single-crystal GaAs body. The mole fraction x of AlAs in the $Al_xGa_{1-x}As$ layer should be sufficiently large to inhibit the flow of current between the metal and semiconductor layers and, preferably, to render the $Al_xGa_{1-x}As$ layer an indirect gap material; that is, if $0.4 \lesssim - <1$, $Al_xGa_{1-x}As$ is an indirect gap material in which the mobility of carriers is more than a factor of 10 smaller than direct gap $Al_xGa_{1-x}As$ ($0 \leq - \lesssim 0.4$). For example, we used molecular beam epitaxy (MBE) to fabricate an MIS structure of this type in which the I-layer was a semi-insulating, single-crystal layer of $Al_{0.5}Ga_{0.5}As$ doped with oxygen. Interface trap effects (dispersion and hysteresis) were not observed in C-V measurements. I-V measurements, however, showed space-charge limited currents for both forward and reverse bias.

Our MIS heterojunction structure can be utilized directly, for example, as the gate of an FET. In order to enhance current isolation (i.e., reduce leakage current) between the metal gate electrode and semiconductor channel layer, however, an amorphous insulator layer can be interposed between the semi-insulating, single-crystal layer and the gate electrode. In this manner, the high resistivity of the amorphous layer can be exploited without introducing deleterious interface states in the semiconductor channel layer.

BRIEF DESCRIPTION OF THE DRAWING

Our invention, together with the various features and advantages, can be readily understood from the following more detailed description taken in conjunction with the accompanying drawing in which the device figures have not been drawn to scale for clarity of illustration.

In FIGS. 4 and 5, device components corresponding to those of FIG. 1 have the same reference numbers increased by 100.

DETAILED DESCRIPTION

MIS Structure

Figure 1:
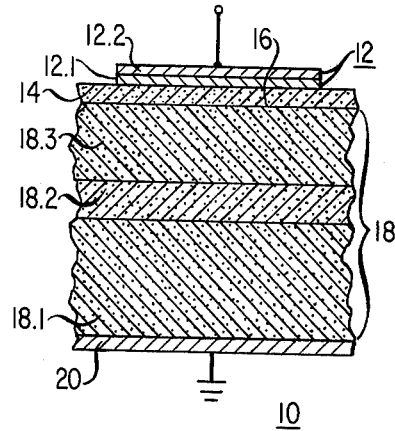
FIG. 1 is a cross-sectional view of an MIS heterojunction structure in accordance with one embodiment of our invention.

With reference now to FIG. 1, there is shown an illustrative embodiment of our invention, an MIS structure 10 comprising a metal electrode 12, a single-crystal, semi-insulating semiconductor layer 14 which has substantially the same lattice constant as, and which forms a substantially lattice-matched heterojunction 16 with, an underlying single-crystal semiconductor body 18, and a metal counter electrode 20. The bandgap of layer 14 should be larger than that of body 18 so that heterojunction 16 inhibits the flow of current from the electrodes into body 18. Preferably, semi-insulating, single-crystal layer 14 is an indirect gap material and includes a deep level impurity in order to render its resistivity in excess of approximately $10^8$ ohm-cm. In the Group III-V compound system, such deep level impurities include, for example, iron, chromium or oxygen.

Thus, in one embodiment, layer 14 comprises single-crystal $Al_xGa_{1-x}As$ doped with oxygen and body 18 comprises single-crystal GaAs. In order for layer 14 to be an indirect gap material, the mole fraction x of AlAs should be greater than approximately 0.4. As described in the example below, interface trap effects were not observed in C-V measurements on MIS heterojunction structures of this type, while the I-V measurements showed space-charge limited currents for both forward and reverse biases.

Example

In this example, device parameters such as layer thicknesses, compositions, carrier concentrations and conductivity types, and impurity species are given by way of illustration only and are not intended to be construed as limitations upon the scope of the invention.

The MIS structure 10 of FIG. 1 comprised an n+-GaSa substrate 18.1 doped with Si to about $1 \times 10^{18}$ cm$^{-3}$, an n$^-$-GaAs epitaxial buffer layer 18.2 doped with Sn to about $2 \times 10^{18}$ cm$^{-3}$ and about 0.4 $\mu$m thick, and n-GaAs epitaxial layer 18.3 doped with Sn to about $1.5 \times 10^{17}$ cm$^{-3}$ and about 1.6 $\mu$m thick, and an $Al_{0.5}Ga_{0.5}As$ layer 14 doped with oxygen and about 7,000 Angstroms thick. Electrode 12 comprised a thin layer 12.1 of Cr deposited on layer 14 and a thicker layer 12.2 of Au deposited on the Cr layer 12.1. The Cr and Au layers were evaporated through a metal mask to form metal dots with diameters from 50 to 500 μm. Counter electrode 20 on substrate 18.1 was made of In. The epitaxial layers 18.2, 18.3 and 14 were all grown by molecular beam epitaxy at a growth temperature of 550° C. During the growth of the semi-insulating $Al_{0.5}Ga_{0.5}As$ layer 14, the arrival rate of the Al and Ga beams was $5 \times 10^{14}$ cm$^{-2}$-sec, and the arrival rate of oxygen, which resulted from dissociation of water vapor, was $5 \times 10^{15}$ cm$^{-2}$-sec. Other sources of oxygen, such as a molecular beam of oxygen generated from an $O_2$ tank and suitable nozzle means, are also useful and indeed may be preferred from the standpoint of controlling the $O_2$ arrival rate.

Figure 2:
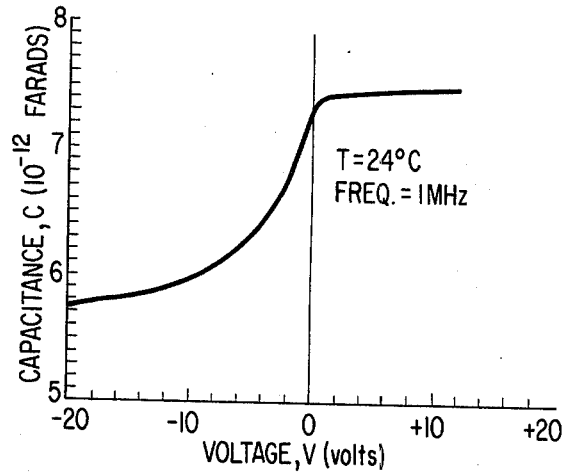
FIG. 2 is a graph showing the capacitance-voltage behavior of an $Au/Cr-Al_{0.5}Ga_{0.5}As-GaAs$ MIS structure of the type shown in FIG. 1. The voltage refers to the potential of the Au layer which had the configuration of a dot of area of $5.0 \times 10^{-4}$ cm$^2$.
Figure 3:
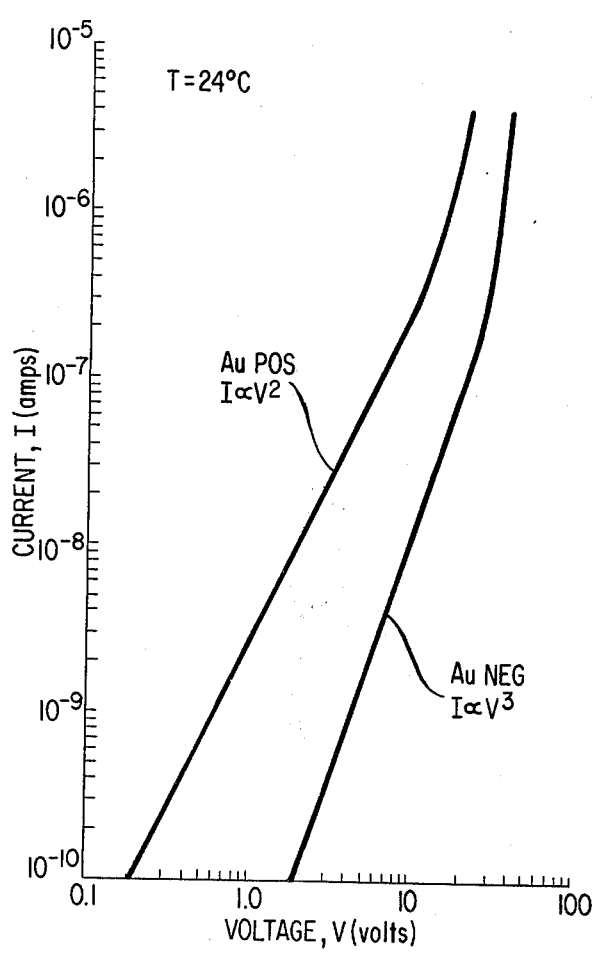
FIG. 3 is a graph of the current-voltage behavior of the MIS structure of FIGS. 1 and 2. Current was found to scale with area.

Capacitance-voltage (C-V) and current-voltage (I-V) characteristics were measured at room temperature and are shown in FIGS. 2 and 3 for the Au/Cr-$Al_{0.5}Ga_{0.5}As$-GaAs MIS structure of FIG. 1. The C-V behavior in FIG. 2 shows no hysteresis for an extensive range of sweep rates. Measurements of C-V between 5 and 500 kHz did not reveal any frequency dispersion. From the geometry of the MIS structure, the capacitance of the semi-insulating layer 14 was found to be 7.2 pF. Use of deep level transient spectroscopy (DLTS) techniques to search for interface states at the GaAs-$Al_{0.5}Ga_{0.5}As$ heterojunction 16 did not reveal observable interface states. Measurement of the device admittance as a function of temperature at various frequencies from 10 to $10^4$ Hz permitted the observation of the dominant deep level in the $Al_{0.5}Ga_{0.5}As$ layer 14. This level is at $0.64 \pm 0.04$ eV with a concentration of about $5 \times 10^{17}$ cm$^{-3}$. These measurements also permitted determination of the metal $Al_{0.5}Ga_{0.5}As$-GaAs energy-band diagram at thermal equilibrium.

An analysis of the slope of the C-V curve of FIG. 2 gives a carrier concentration of $2.5 \times 10^{16}$ cm$^{-3}$ rather than the true value of $1.5 \times 10^{17}$ cm$^{-3}$ obtained by Schottky barrier measurements made after the $Al_{0.5}Ga_{0.5}As$ layer 14 had been removed. This difference cannot be attributed to effects which stretch out the C-V curve along the voltage axis, such as interface traps, because the estimated value of doping concentration would be larger, not smaller, than the true value. With a Miller feedback profiler, the true value of $1.5 \times 10^{17}$ cm$^{-3}$ was obtained for the MIS structure. The difference in the results for these two measurements techniques is due to the different $\Delta V$ used in the two measurements. The capacitance for low frequency $\Delta V$ (FIG. 2) is influenced by a significant trap concentration in the semi-insulating layer, while the measurement for the high frequency $\Delta V$ (Miller feedback profiler) is not.

The I-V behavior in FIG. 3 is characteristic of space-charge limited current (SCL) in insulators. With the potential of Au-Cr electrode 12 positive, the voltage-squared dependence is characteristic of SCL current due to the injection of a single carrier (electrons). For negative electrode potential, the voltage-cubed dependence is characteristic of SCL current due to the injection of both electrons and holes. The injection of electrons from the n-GaAs body 18 at forward bias suggests that accumulation has been achieved, while the whole injection at reverse suggests inversion.

Due to the absence of hysteresis and dispersion in the C-V measurements, and the absence of observable interface states by DLTS, it appears that the interface trap concentration is very small at the heterojunction 16. These results are sufficiently promising to suggest the use of single-crystal, semi-insulating heterojunctions, such as oxygen, iron or chromium-doped $Al_xGa_{1-x}As$-GaAs heterojunctions, $(0.4 \lesssim x < 1)$, in FET devices of the type described below.

FET Devices

Figure 4:
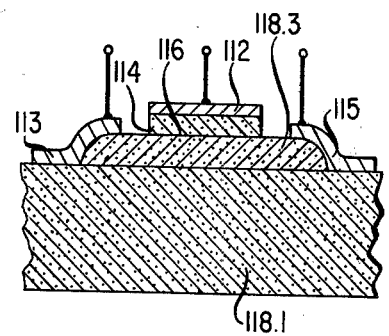
FIG. 4 is a schematic cross-sectional view of an FET incorporating an MIS heterojunction structure in accordance with another embodiment of our invention.

Using the foregoing oxygen-doped $Al_xGa_{1-x}As$-GaAs heterojunction as an illustration, the FET of FIG. 4 would comprise, for example, a semi-insulating, single-crystal GaAs substrate 118.1 (e.g., Cr-doped GaAs) and a high conductivity n-GaAs epitaxial layer 118.3 formed on a selected area of substrate 118.1. Layer 118.3, in which ultimately the channel of the FET will be formed, may be separated from the substrate 118.1 by a suitable GaAs buffer layer not shown. A semi-insulating, single-crystal layer of oxygen-doped $Al_xGa_{1-x}As$ $(0.4 < x < 1)$ is formed on a central zone of layer 118.3, thereby forming a substantially lattice-matched heterojunction 116 at the interface therebetween. A gate electrode is deposited on semi-insulating layer 114 and ohmic source and drain electrodes 113 and 115 are formed on layer 118.3 on opposite sides of the gate electrode 112. The general operation of this type of FET structure is well known in the prior art and will not be repeated here in the interests of brevity. However, the absence of interface traps at heterojunction 116 means that the FET is substantially free of hysteresis and dispersion and, hence, undesired increases in noise and decreases in gain.

Figure 5:
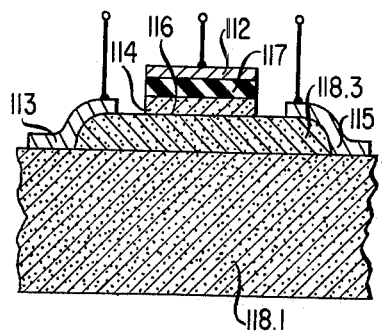
FIG. 5 is a schematic cross-sectional view of an FET incorporating an MIS heterojunction structure in accordance with yet another embodiment of our invention in which an amorphous insulating layer is interposed between the single-crystal, semi-insulating layer and the metal gate electrode.

In order to enhance the current isolation (i.e., reduce leakage current) between gate electrode 112 and both the source and drain electrodes 113 and 115, it may be desirable as depicted in FIG. 5 to interpose an amorphous insulating layer 117, such as silicon dioxide or silicon nitride, between the semi-insulating layer 114 and the gate electrode 112. As mentioned previously, this configuration permits the high resistivity property of an amorphous layer to be exploited while at the same time preventing deleterious interface traps from being created at the critical interface 116 with the channel layer in 118.3.

It is to be understood that the above described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

In particular, it should be apparent that our MIS heterojunction structure can be fabricated utilizing other Group III-V compound materials which are capable of forming substantially lattice-matched heterojunctions and at the same time high resistivity layers. Such materials include, for example, GaAs-GaInP as well as AlGaAs-GaInP, GaAs-AlInP, $Al_xGa_{1-x}As$-$Al_yGa_{1-y}As$ with $x \neq y$, and GaP-AlGaP.

In addition, as used herein, an insulative layer is an insulator with a resistivity in excess of about $5 \times 10^{12}$ ohm-cm or a semi-insulator with a resistivity between about $5 \times 10^8$ ohm-cm and $5 \times 10^{12}$ ohm-cm which results in space-charge limited current. In contrast, a semiconductive layer is a semiconductor having a resistivity between about $5 \times 10^8$ ohm-cm and $10^{-5}$ ohm-cm and encompasses both relaxation semiconductors (about $5 \times 10^8$–$5 \times 10^4$ ohm-cm; $\tau_{n,p} < \tau_D$) and lifetime semiconductors (about $5 \times 10^4$–$10^{-5}$ ohm-cm; $\tau_{n,p} < \tau_D$) where the dielectric relaxation time $\tau_D = \rho \epsilon \approx \rho \times 10^{<12}$ sec, $\rho$ is resistivity, $\epsilon$ is the dielectric constant and $\tau_{n,p}$ is the minority carrier lifetime for electrons (n) or holes (p). Note, however, that some materials such as Cr-doped GaAs, which has a resistivity of about $10^7$ ohm-cm, are actually relaxation-case semiconductors but are commonly referred to in the art as semi-insulators.

What is claimed is:

1. A semiconductor device comprising
a single-crystal semiconductor body,
an insulative layer formed on a major surface of said body, and
a metal electrode formed on said insulative layer
CHARACTERIZED IN THAT
said insulative layer comprises a single-crystal layer having a resistivity in excess of about $10^8$ ohm-cm and adapted to prevent any substantial flow of current therethrough, said insulative layer having a wider bandgap than, but substantially the same lattice constant as, said body so as to form a substantially lattice-matched heterojunction at the interface between said body and said insulative layer.

2. The device of claim 1 wherein said body and said layer comprise Group III-V compound materials.

3. The device of claim 2 wherein said layer includes a deep level impurity selected from the group consisting of iron, chromium, and oxygen.

4. The device of claim 2 wherein said insulative layer comprises $Al_xGa_{1-x}As$ $(0 < X < 1)$ and said body comprises GaAs.

5. The device of claim 4 wherein said insulative layer is doped with oxygen.

6. The device of claim 4 wherein x is adapted so that said insulative layer is an indirect gap material.

7. The device of claim 1 further including an amorphous insulative layer disposed between said metal electrode and said single-crystal insulative layer.

8. A seimconductor device comprising
a single-crystal body of GaAs,
a single-crystal layer of $Al_xGa_{1-x}As$, $0.4 \lesssim X < 1$, grown on a major surface of said body so as to form a substantially lattice-matched heterojunction at the interface between said body and said layer, said layer being grown by molecular beam epitaxy and doped with oxygen so that its resistivity is in excess of approximately $10^8$ ohm-cm and any substantial flow of current therethrough is prevented, and
a metal electrode formed on said layer.

9. The device of claim 8 further including an amorphous insulative layer disposed between said metal electrode and said $Al_xGa_{1-x}As$ layer.

* * * * *

UNITED STATES PATENT AND TRADEMARK OFFICE
CERTIFICATE OF CORRECTION

PATENT NO. : 4,160,261
DATED : July 3, 1979
INVENTOR(S) : Horace C. Casey, Jr., Alfred Y. Cho, and Edward H. Nicollian It is certified that error appears in the above–identified patent and that said Letters Patent are hereby corrected as shown below:

Column 1, line 34, "-<1" should read --$x < 1$--. Column 2, line 62, "$n^-$" should read --$n^+$--; lines 64 and 65, "$Al_0.5$" should read --$Al_{.5}$--. Column 3, lines 6 and 7, "$Al_0.5$ should read --$Al_{.5}$--; line 25, "AS" should read --As--. Column 4, line 16, "<X<" should read --$\leq x <$--; line 66, "<" should read -->--; line 67, "$10^{<12}$" should read --$10^{-12}$--.

Signed and Sealed this

First Day of January 1980

[SEAL]

Attest:

SIDNEY A. DIAMOND

Attesting Officer

Commissioner of Patents and Trademarks